United States Patent
Fukushima (10) Patent No.: US 12,447,507 B2
(45) Date of Patent: Oct. 21, 2025

(54) WAFER BACK SURFACE CLEANING DEVICE

(71) Applicant: TOKYO SEIMITSU CO., LTD., Hachioji (JP)

(72) Inventor: Junichi Fukushima, Hachioji (JP)

(73) Assignee: TOKYO SEIMITSU CO., LTD., Tokyo (JP)

( * ) Notice: Subject to any disclaimer, the term of this patent is extended or adjusted under 35 U.S.C. 154(b) by 171 days.

(21) Appl. No.: 18/283,186

(22) PCT Filed: Dec. 14, 2021

(86) PCT No.: PCT/JP2021/045925
§ 371 (c)(1),
(2) Date: Sep. 20, 2023

(87) PCT Pub. No.: WO2022/201666
PCT Pub. Date: Sep. 29, 2022

(65) Prior Publication Data
US 2024/0173750 A1    May 30, 2024

(30) Foreign Application Priority Data

Mar. 26, 2021 (JP) .................. 2021-052536

(51) Int. Cl.
*B08B 1/32* (2024.01)
*B08B 1/14* (2024.01)
(Continued)

(52) U.S. Cl.
CPC ................ *B08B 1/14* (2024.01); *B08B 1/143* (2024.01); *B08B 1/36* (2024.01); *B08B 3/02* (2013.01);
(Continued)

(58) Field of Classification Search
CPC .. B08B 1/143; B08B 1/36; B08B 1/32; B08B 3/02; B08B 1/14; H01L 21/683; H01L 21/304
See application file for complete search history.

(56) References Cited

U.S. PATENT DOCUMENTS 6,115,867 A     9/2000  Nakashima et al. ............... 15/77
6,652,662 B1 *  11/2003 Ishihara .................... B08B 1/00
                                                        134/104.1
(Continued)

FOREIGN PATENT DOCUMENTS

JP    H07335599    12/1995
JP    H09298181    11/1997
(Continued)

OTHER PUBLICATIONS

International Preliminary Report on Patentability, PCT/JP2021/045925 dated Sep. 12, 2023, 4 pages.

(Continued)

*Primary Examiner* — Benjamin L Osterhout
(74) *Attorney, Agent, or Firm* — Fattibene and Fattibene, LLC; Paul A. Fattibene (57) ABSTRACT

A wafer back surface cleaning device preventing foreign matter from re-adhering to a wafer during and after cleaning. A hand H1 receives a wafer that has been cleaned at a cleaning position and conveys the wafer to a subsequent process, a hand H2 conveys the wafer before grinding to the cleaning position and transfers the wafer that has been cleaned to hand H1 with a front surface of the wafer directed upward. A cleaning pad and a cleaning water supply nozzle discharges the cleaning water to a back surface of the wafer, at the cleaning position, the hand H2 brings the back surface of the wafer to the cleaning position into contact with the cleaning pad to scrub, and receives the cleaning water on the (Continued)

back surface of the wafer after scrub cleaning to perform rinse cleaning, and then transfers the wafer to the hand H1.

4 Claims, 9 Drawing Sheets

(51) Int. Cl.
  *B08B 1/36* (2024.01)
  *B08B 3/02* (2006.01)
  *H01L 21/304* (2006.01)
  *H01L 21/683* (2006.01)

(52) U.S. Cl.
  CPC ............... *B08B 1/32* (2024.01); *H01L 21/304* (2013.01); *H01L 21/683* (2013.01)

(56) References Cited

U.S. PATENT DOCUMENTS

| | | | | |
|---|---|---|---|---|
| 2002/0050322 A1* | 5/2002 | Kunisawa | ........... | H01L 21/6838 |
| | | | | 156/345.11 |
| 2003/0092264 A1* | 5/2003 | Kajita | ................ | H01L 21/6708 |
| | | | | 257/E21.309 |
| 2008/0163899 A1* | 7/2008 | Takiguchi | ............. | B08B 7/0057 |
| | | | | 134/30 |
| 2008/0173333 A1 | 7/2008 | Nanba et al. | ................... | 134/30 |
| 2009/0202951 A1* | 8/2009 | Yamamoto | ............... | B05D 5/06 |
| | | | | 134/198 |
| 2018/0315622 A1* | 11/2018 | Kobayashi | ........ | H01L 21/67046 |

FOREIGN PATENT DOCUMENTS

| | | |
|---|---|---|
| JP | H1167705 | 3/1999 |
| JP | 2003297793 | 10/2003 |
| JP | 2008135703 | 6/2008 |
| JP | 2010094785 | 4/2010 |

OTHER PUBLICATIONS

Office Action in counterpart Korean application No. 10-2023-7032808, Dispatch Date Sep. 27, 2024; with English translation; 10 pages.

International Search Report, PCT/JP2021/045925, dated Feb. 22, 2022, 2 pages.

Notice of Final Rejection in counterpart Korean application No. 10-2023-7032808, Dispatch Date Feb. 21, 2025; with English translation; 8 pages.

* cited by examiner

WAFER BACK SURFACE CLEANING DEVICE

TECHNICAL FIELD

The present invention relates to a wafer back surface cleaning device that cleans a back surface of a semiconductor wafer before grinding the semiconductor wafer, for example.

BACKGROUND ART

Generally, in a process for manufacturing a semiconductor device, a process for removing dirt that has adhered in a process before wafer grinding to a semiconductor wafer such as a silicon wafer (hereinafter referred to as a "wafer"), e.g., foreign matter such as particles or contamination has been required.

There has been known, as a device that performs cleaning treatment on a back surface of the wafer, one in which a rotation plate being rotatable is provided on the back surface side of the wafer, a hole provided at the center of the rotation plate is provided with a non-rotation liquid discharge plate having a wafer support mechanism and a liquid discharge port, the liquid discharge plate is made movable up and down to receive the wafer with the liquid discharge plate protruding upward, the liquid discharge plate is then lowered to horizontally hold the wafer by a holding member provided in the rotation plate, and a treatment liquid and a rinse liquid are supplied between the wafer and the rotation plate from the liquid discharge nozzle continuously provided below the liquid discharge port to clean the back surface of the wafer with a liquid film formed (see, e.g., Patent Literature 1 and Patent Literature 2).

However, in the cleaning treatment described in Patent Literature 1 and Patent Literature 2, when the foreign matter is sandwiched between the rotation plate and the back surface of the wafer, processing finish of the wafer is adversely affected.

Figure 7:
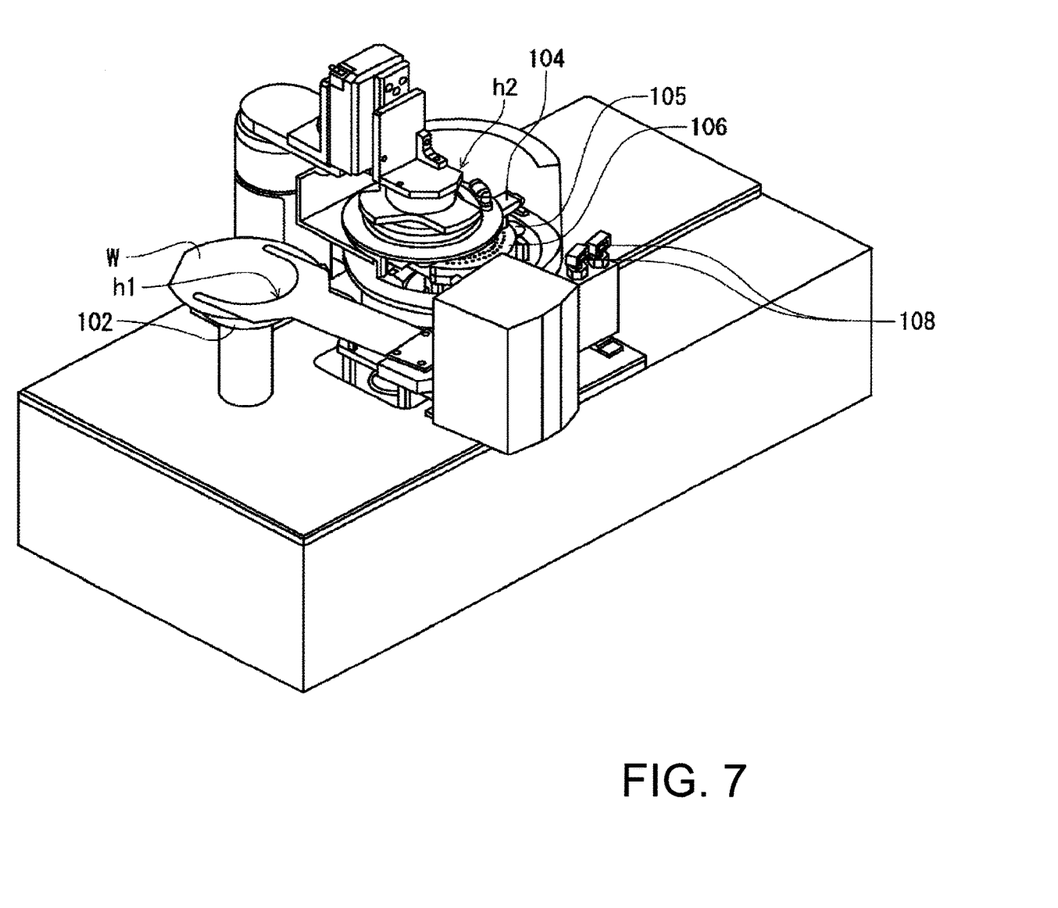
FIG. 7 is an overall perspective view illustrating an example of a conventional wafer back surface cleaning device.
Figure 8:
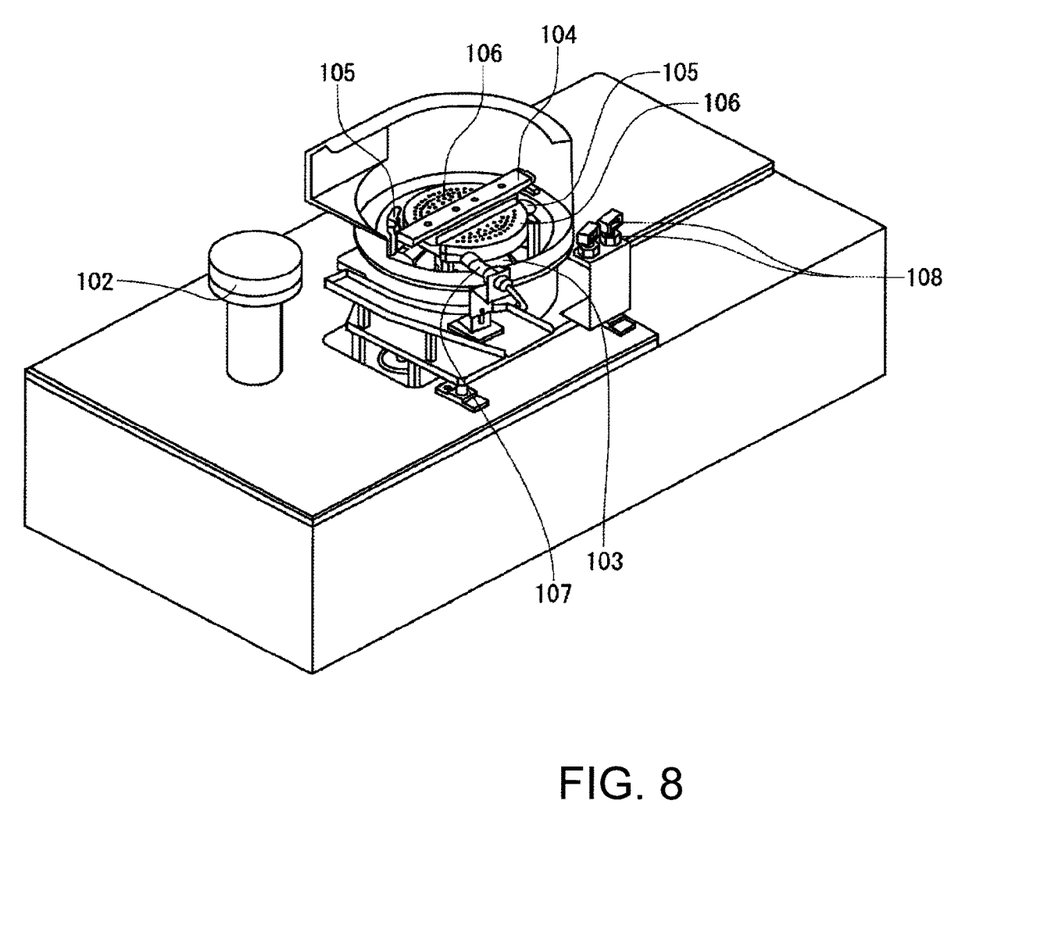
FIG. 8 is a perspective view illustrating a configuration of the inside of the wafer back surface cleaning device illustrated in FIG. 7 by omitting some of components constituting the cleaning device.

Nowadays, an automated wafer back surface cleaning device 101 illustrated in FIGS. 7 and 8, for example, is proposed. FIG. 7 is a perspective view of the entire wafer back surface cleaning device 101, and FIG. 8 is a perspective view illustrating the inside of a cleaning position by omitting some of components. The wafer back surface cleaning device 101 illustrated in FIGS. 7 and 8 includes a hand h2 that conveys a wafer W before grinding to a cleaning position (a position illustrated in FIG. 7) from a position of an alignment 102 with a front surface of the wafer W directed upward) and a hand h1 not illustrated that receives the wafer W that has been cleaned at the cleaning position and conveys the wafer W to a subsequent wafer grinding process.

There are provided at the cleaning position a rotation plate 103 that rotates, a cleaning pad 104 composed of a sponge, for example, which rotates integrally with the rotation plate 103, a cleaning water supply nozzle 105 that supplies cleaning water (purified water) to the cleaning pad 104 during the cleaning, and a wafer suction pad 106 that holds the wafer W after the cleaning, and there is provided an air blow 107, provided at a non-rotation position, which blows drying air to a back surface of the wafer W after the cleaning, the hand h2, and the wafer suction pad 106.

Figure 9:
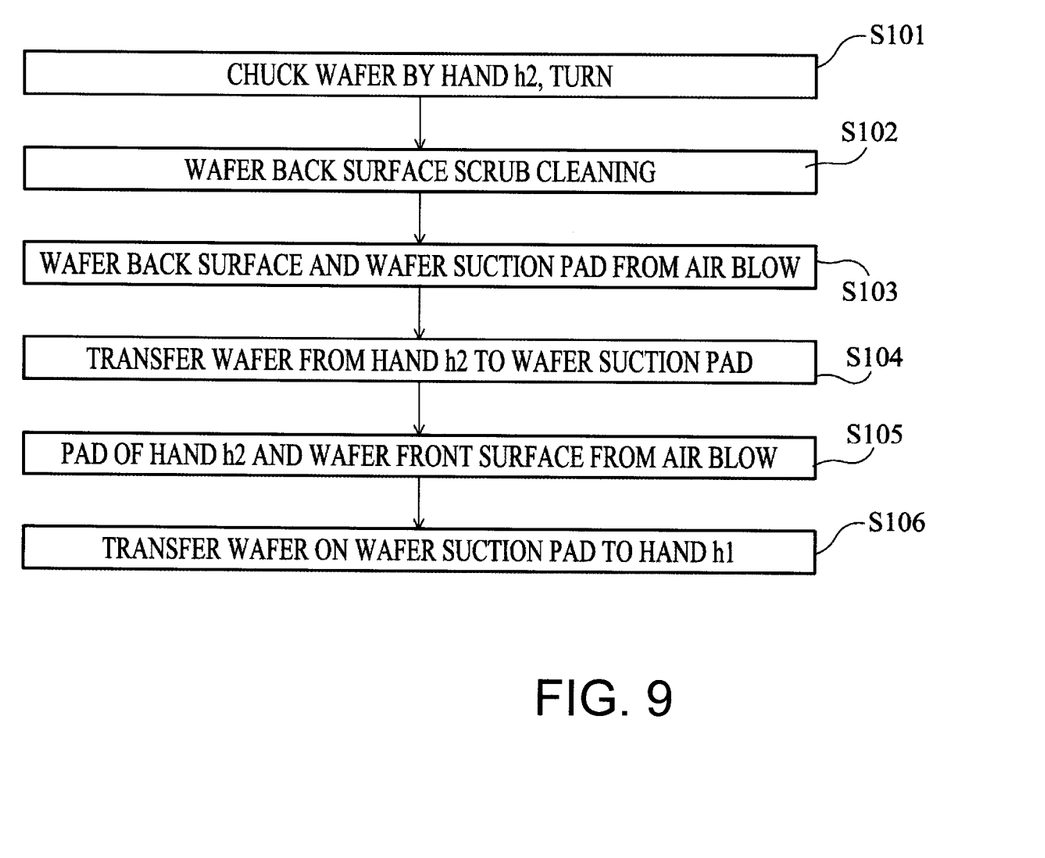
FIG. 9 is a flowchart illustrating an example of one operation of the conventional wafer back surface cleaning device illustrated in FIG. 7.

An example of operations of the wafer back surface cleaning device 101 thus configured is illustrated as an operation flow in FIG. 9. According to the operation flow illustrated in FIG. 9, the respective operations of the wafer back surface cleaning device 101 in steps S101 to step S106 will be described in this order. First, the wafer W before grinding that has been conveyed onto the alignment 102 is chucked (gripped) by the hand h2, the hand h2 turns, and the chucked wafer W is carried to the cleaning position as it is (step S101).

At the cleaning position, the hand h2 presses the wafer W against the cleaning pad 104 that is rotating to perform scrub cleaning treatment (step S102).

When the scrub cleaning treatment is finished, the hand h2 separates from the cleaning pad 104 with the wafer W gripped. At the cleaning position, the wafer suction pad 106 rises, and the wafer suction pad 106 is arranged above the cleaning pad 104. Drying air is blown to the back surface of the wafer W and the wafer suction pad 106, respectively, from the air blow 107 and an air blow 108, and foreign matter or water remaining on the back surface of the wafer W is removed and foreign matter or water on the wafer suction pad 106 is removed (step S103).

Then, the hand h2 falls, and the hand h2 transfers the gripped wafer W once onto the wafer suction pad 106 (step S104). Only the hand h2 rises to a predetermined position. Then, drying air is blown to a pad portion of the hand h2 and a front surface of the wafer W from the air blow 107 to prevent sticking with water during conveyance, whereby foreign matter or water that has adhered to the pad portion of the hand h2 is removed. Drying air is also blown from the air blow 108, whereby foreign matter or water that has adhered to the front surface of the wafer W is removed (step S105).

If air cleaning by the air blow 107 and the air blow 108 is finished, the wafer W on the wafer suction pad 106 is transferred to the other hand h1, and the hand h1 conveys the wafer W that has been cleaned to a subsequent wafer grinding process (step S106). As a result, the operations in one cycle are finished.

CITATION LIST

Patent Literature

Patent Literature 1: Japanese Patent Laid-Open No. 9-298181
Patent Literature 2: Japanese Patent Application No. 4940066

SUMMARY OF INVENTION

Technical Problem

However, in a type of wafer back surface cleaning device that performs scrub cleaning using the cleaning pad 104 formed of a sponge or the like, like the wafer back surface cleaning device 101 illustrated in FIGS. 7 and 8, dirt of the sponge or the like may remain on the back surface of the wafer W.

During the wafer conveyance after the cleaning, the back surface of the wafer W contacts the wafer suction pad 106 so that the dirt may re-adhere thereto.

Further, during the wafer conveyance after the cleaning, the air is blown to the front surface of the wafer W and the hand to prevent the sticking with water. However, the foreign matter may re-adhere to the back surface of the wafer W.

Therefore, there occurs a technical problem to be solved to provide a wafer back surface cleaning device capable of preventing foreign matter or the like from re-adhering to front and back surfaces of a wafer W, and the present invention has its object to solve this problem.

Solution to Problem

The present invention has been proposed to attain the above-described object, and the invention set forth in an embodiment provides a wafer back surface cleaning device that cleans a back surface of a wafer, the wafer back surface cleaning device including a first hand that receives the wafer that has been cleaned, a second hand that holds the wafer with its front surface directed upward, conveys the wafer before the cleaning to a cleaning position, and transfers the wafer after the cleaning to the first hand, and a cleaning pad capable of contacting the back surface of the wafer by sliding and a cleaning water supply nozzle that discharges cleaning water to the back surface of the wafer, which are arranged at the cleaning position, in which the second hand brings the back surface of the wafer into contact with the cleaning pad with the cleaning water supply nozzle supplying the cleaning water to the back surface of the wafer in scrub cleaning, separates the wafer after the scrub cleaning from the cleaning pad with the cleaning water supply nozzle supplying the cleaning water to the back surface of the wafer in rinse cleaning, and transfers the wafer to the first hand after the rinse cleaning.

According to this configuration, the wafer before wafer grinding placed at an alignment position or the like is gripped with the back surface of the wafer directed downward by the second hand, is conveyed to the cleaning position, and is subjected to the scrub cleaning and the rinse cleaning at the cleaning position. The second hand can bring the cleaning pad into contact with the back surface of the wafer with the cleaning water supply nozzle supplying the cleaning water to the back surface of the wafer in the scrub cleaning, separate the wafer after the scrub cleaning from the cleaning pad with the cleaning water supply nozzle supplying the cleaning water to the back surface of the wafer in the rinse cleaning, and transfer the wafer to the first hand after the rinse cleaning. As a result, the back surface of the wafer is subjected to the scrub cleaning by the cleaning pad such as a sponge, and the cleaning water is further poured over the entire back surface of the wafer from the cleaning water supply nozzle as finish to perform rinse cleaning treatment, thereby making it possible to expect an effect of washing away dirt that has floated by scrub cleaning treatment. A series of operations performed until the second hand receives the wafer from a predetermined position such as the alignment position and transfers the wafer to the first hand after the cleaning can be performed upon gripping the wafer by the same second hand without changing the grip. Accordingly, foreign matter or the like can be prevented from re-adhering to the front and back surfaces of the wafer W during and after the cleaning.

The invention set forth in another embodiment provides the wafer back surface cleaning device in which the cleaning water supply nozzle discharges the cleaning water obliquely with respect to the back surface of the wafer.

According to this configuration, the cleaning water supply nozzle discharges the cleaning water from the cleaning water supply nozzle that rotates integrally with the rotation plate obliquely with respect to the back surface of the wafer, whereby the cleaning water can be spread over the entire back surface of the wafer. As a result, the foreign matter or the like, which cannot be completely removed by the scrub cleaning treatment, can be further removed and eliminated by the cleaning treatment.

The invention set forth in another embodiment provides the wafer back surface cleaning device in which a cylindrical cover arranged to surround an outer periphery of the wafer is provided at the cleaning position.

According to this configuration, the cylindrical cover can prevent the cleaning liquid from being splashed toward the front surface side of the wafer during each of the scrub cleaning treatment and the rinse cleaning treatment to wrap around the front surface side of the wafer and the second hand side.

The invention set forth in another embodiment provides the wafer back surface cleaning device in which the first hand grips an outer peripheral portion of the wafer when receiving the wafer from the second hand.

According to this configuration, the first hand receives the wafer after the cleaning from the second hand with the outer peripheral portion of the wafer gripped, whereby the wafer can be conveyed to a subsequent grinding process while maintaining a state of the wafer after the cleaning.

Advantageous Effect of Invention

According to the present invention, a back surface of a wafer is subjected to scrub cleaning using a cleaning pad such as a sponge, and cleaning water such as purified water is poured over the entire back surface of the wafer as finish to perform rinse treatment, thereby making it possible to expect an effect of further removing dirt, which has floated by the scrub cleaning, by rinse cleaning treatment.

A series of operations performed until the wafer is transferred to a first hand after being received from a predetermined position such as an alignment position and cleaned can be continuously performed upon gripping the wafer by a second hand. Accordingly, foreign matter or the like can be prevented from re-adhering on front and back surfaces of the wafer W during and after the cleaning.

The series of operations can be continuously performed upon gripping the wafer by the second hand, thereby making it possible to shorten a tact time and to contribute to an improvement in productivity.

DESCRIPTION OF EMBODIMENT

To attain an object to provide a wafer back surface cleaning device capable of preventing foreign matter or the like from re-adhering to front and back surfaces of a wafer W during and after cleaning, the present invention has implemented a wafer back surface cleaning device that cleans a back surface of a wafer by being configured to include a first hand that receives the wafer that has been cleaned, a second hand that holds the wafer with its front surface directed upward, conveys the wafer before the cleaning to a cleaning position, and transfers the wafer after the cleaning to the first hand, and a cleaning pad capable of contacting the back surface of the wafer by sliding and a cleaning water supply nozzle that discharges cleaning water to the back surface of the wafer, which are arranged at the cleaning position, and such that the second hand brings the back surface of the wafer into contact with the cleaning pad with the cleaning water supply nozzle supplying the cleaning water to the back surface of the wafer in scrub cleaning, separates the wafer after the scrub cleaning from the cleaning pad with the cleaning water supply nozzle supplying the cleaning water to the back surface of the wafer in rinse cleaning, and transfers the wafer to the first hand after the rinse cleaning.

Example

An example of an embodiment of the present invention will be described in detail below with reference to the accompanying drawings. In the following example, when reference is made to the number of components or a numerical value, amount, range, or the like of each of the components, the number or the like is not limited to a particular number but may be the particular number or more or the particular number or less unless otherwise stated or except when expressly limited to the particular number in principle.

When reference to a shape of each of components and a positional relationship among the components, a substantially approximate or similar shape or the like is included unless otherwise stated or except when considered to be expressly excluded in principle.

In the drawings, there is a case where characteristic portions are exaggerated by being enlarged, for example, in order to facilitate the understanding of features, and a dimension ratio or the like of each of the components is not necessarily the same as an actual one. In a cross-sectional view, hatching of some of the components may be omitted in order to facilitate the understanding of a cross-sectional structure of the components.

In the following description, terms representing directions such as up-down and left-right directions are not absolute, but are appropriate if each of sections in a wafer back surface cleaning device according to the present invention is in a depicted orientation. However, if the orientation has changed, the terms should be construed by being changed depending on the change in the orientation. Throughout the entire description of the example, the same elements are respectively denoted by the same reference numerals.

Figure 1:
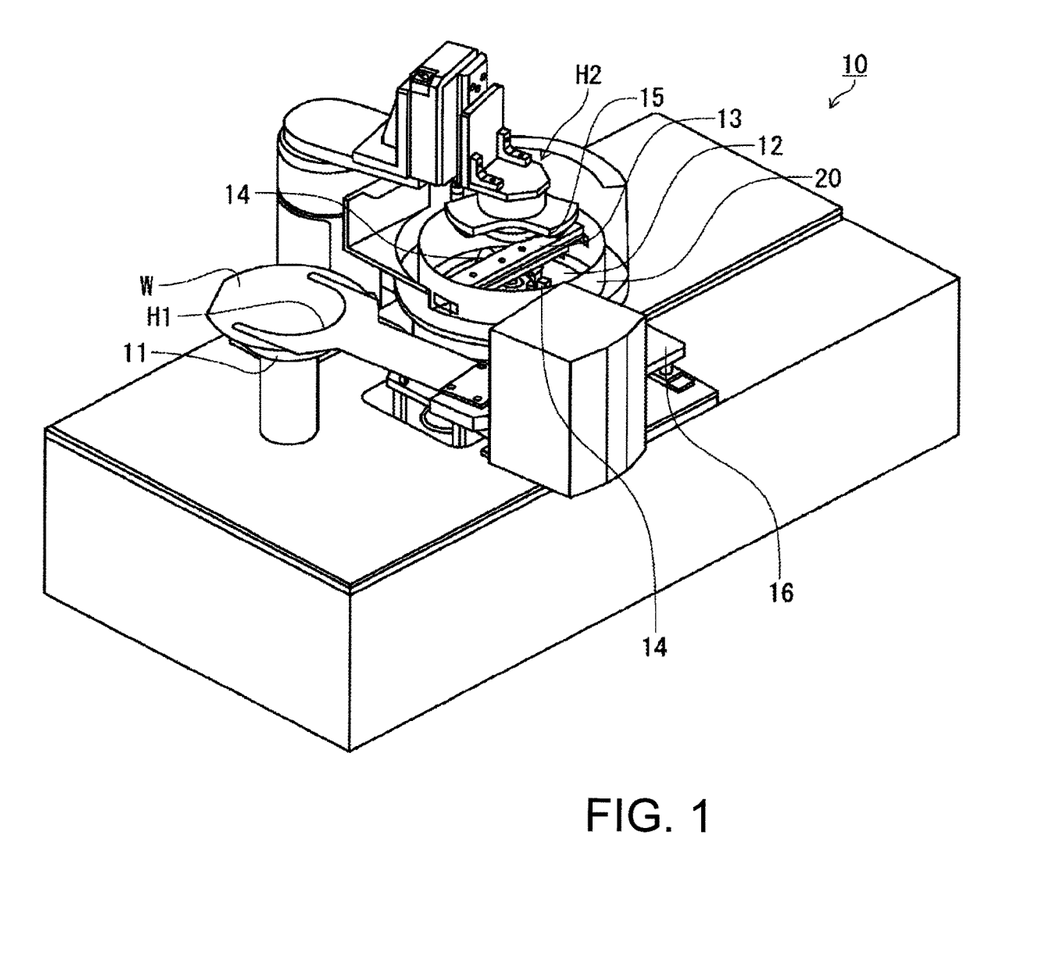
FIG. 1 is a schematic overall perspective view of a wafer back surface cleaning device illustrated as an example of an embodiment of the present invention.
Figure 2:
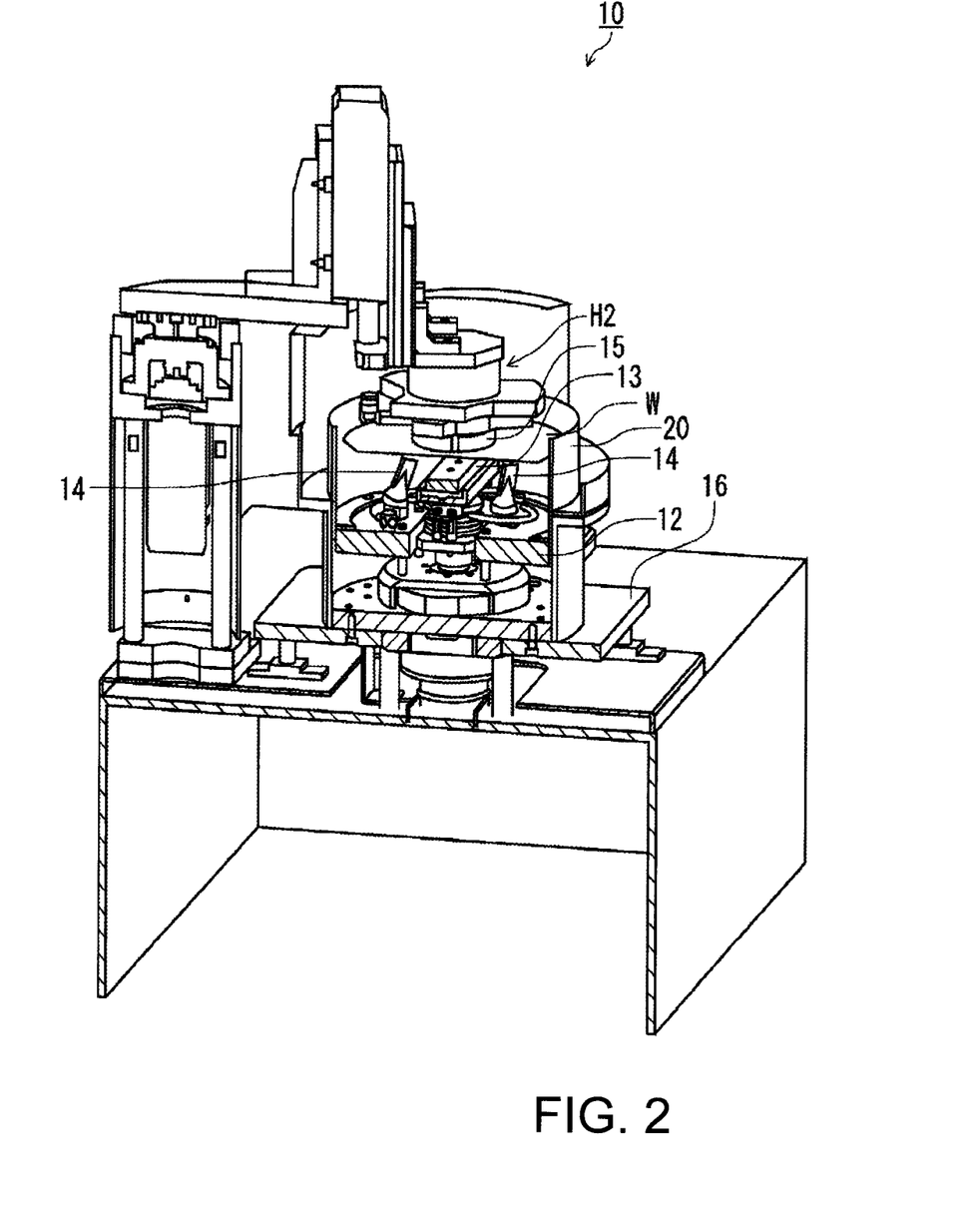
FIG. 2 is a partially cutaway perspective view illustrating an internal structure of the wafer back surface cleaning device.
Figure 3:
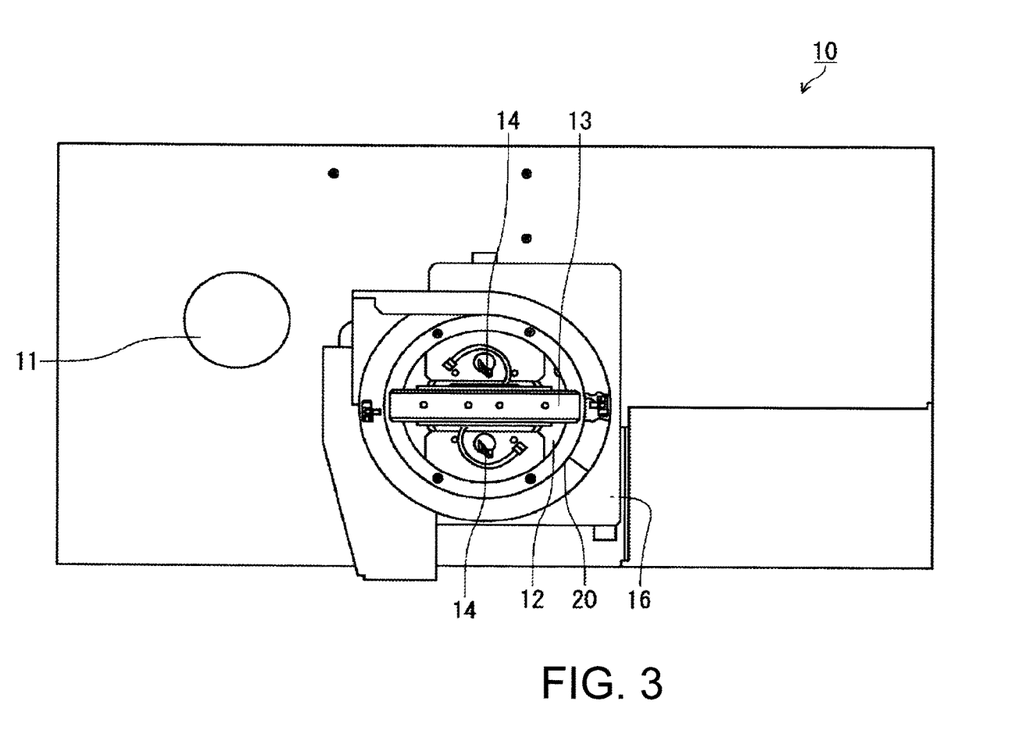
FIG. 3 is a partially omitted plan view illustrating the inside of the wafer back surface cleaning device.

FIGS. 1 to 3 illustrate a wafer back surface cleaning device 10 according to the present invention, where FIG. 1 is a schematic overall perspective view, FIG. 2 is a partially cutaway perspective view illustrating an internal structure of the wafer back surface cleaning device 10, and FIG. 3 is a partially omitted plan view illustrating the inside of the wafer back surface cleaning device 10.

In FIGS. 1 to 3, the wafer back surface cleaning device 10 is an automated device, which includes a hand H2 as a second hand that grips a wafer W before grinding from a position on an alignment 11 with a front surface of the wafer W directed upward, conveys the gripped wafer W to a cleaning position (a position illustrated in FIGS. 1 and 2), and grips the wafer W until cleaning treatment is finished and a hand H1 as a first hand that receives the wafer W that has been cleaned at the cleaning position and conveys the wafer W to a subsequent process.

At the cleaning position, there are provided a rotation plate 12 that rotates, a cleaning pad 13 composed of a sponge, for example, which rotates integrally with the rotation plate 12, and a cleaning water supply nozzle 14 that supplies cleaning water (purified water) to the cleaning pad 13 and supplies cleaning water (purified water) for rinsing to a back surface of the wafer W during cleaning. At the cleaning position, a cylindrical cover 20 is provided to surround the outside of the rotation plate 12.

The hand H2 includes a wafer suction pad 15 as a ceramic porous chuck that vacuum-chucks an upper surface of the wafer W and grips the wafer W. The hand H2 is horizontally turnable and movable in an up-down direction. On the other hand, the hand H1 has a function of conveying the wafer W before processing onto the alignment 11 from a predetermined position, receiving the wafer W cleaned at the cleaning position from the hand H2, and gripping the wafer W and conveying the wafer W to a subsequent grinding process. When gripping the wafer W, the hand H1 can convey the wafer W by gripping an outer peripheral surface of the wafer W with a front surface of the wafer W directed upward.

A position of the cleaning pad 13 can be adjusted in the up-down direction with respect to the rotation plate 12 and the cleaning water supply nozzle 14. That is, when scrub cleaning treatment is performed, the cleaning pad 13 moves to an upper position, i.e., a position protruding more upward than cleaning water discharge of the cleaning water supply nozzle 14, receives cleaning water to be discharged toward the back surface of the wafer W from the discharge port of the cleaning water supply nozzle 14, and performs scrub cleaning using the cleaning water. On the other hand, when the scrub cleaning treatment is finished, the cleaning pad 13 moves toward a lower position, i.e., more downward than the cleaning water discharge of the cleaning water supply nozzle 14, and is arranged at a position not interfering with rinse cleaning treatment by the cleaning water supply nozzle 14, described below.

A pair of cleaning water supply nozzles 14 is provided at left and right positions with the cleaning pad 13 sandwiched therebetween, as illustrated in FIG. 3. The direction of the discharge port of the cleaning water supply nozzle 14 is set to discharge cleaning water obliquely from below toward the back surface of the wafer W, as specifically described in FIG. 4. When the discharge of the cleaning water from the cleaning water supply nozzle 14 that rotates integrally with the rotation plate 12 is thus performed obliquely from below toward the back surface of the wafer, the cleaning water discharged and sprayed toward the back surface of the wafer W flows along the entire back surface, and the cleaning water can be spread over the entire back surface of the wafer W. Although the pair of cleaning water supply nozzles 14 is provided at left and right positions with the cleaning pad 13 sandwiched therebetween, a structure in which only one of them is provided on one side may be used.

Figure 4:
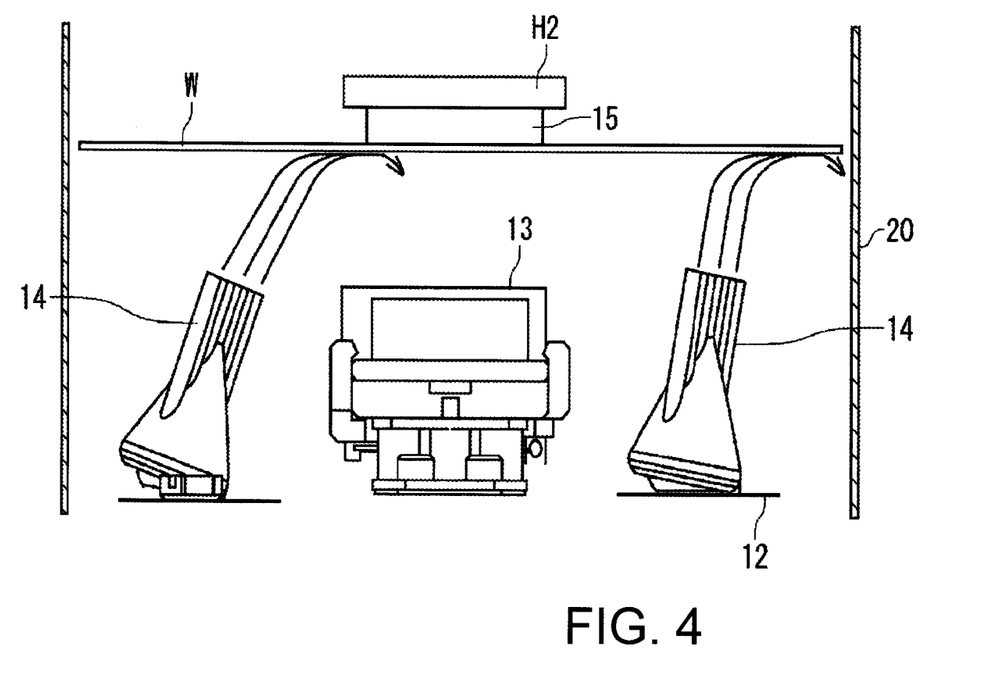
FIG. 4 is a schematic view illustrating discharge of cleaning water from a cleaning water supply nozzle and a function of a cylindrical cover in the wafer back surface cleaning device.

The cover 20 is a cylindrical cover produced by molding plastic such as polyvinylchloride (PVC), and is fixed to the rotation plate 12 to integrally rotate. The inner diameter of the cover 20 is made slightly larger than the outer diameter of the wafer W. A gap between an outer peripheral edge of the wafer W and the cover 20 is set to such an extent that cleaning water discharged obliquely toward the back surface of the wafer W from the cleaning water supply nozzle 14 can be prevented from wrapping around the front surface side of the wafer W.

Operations of the wafer back surface cleaning device 10 are controlled by control means not illustrated. The control means controls each of components constituting the wafer back surface cleaning device 10. The control means is a computer, for example, and includes a CPU, a memory, and the like. A function of the control means may be implemented by control using software or may be implemented by operating using hardware.

Figure 5:
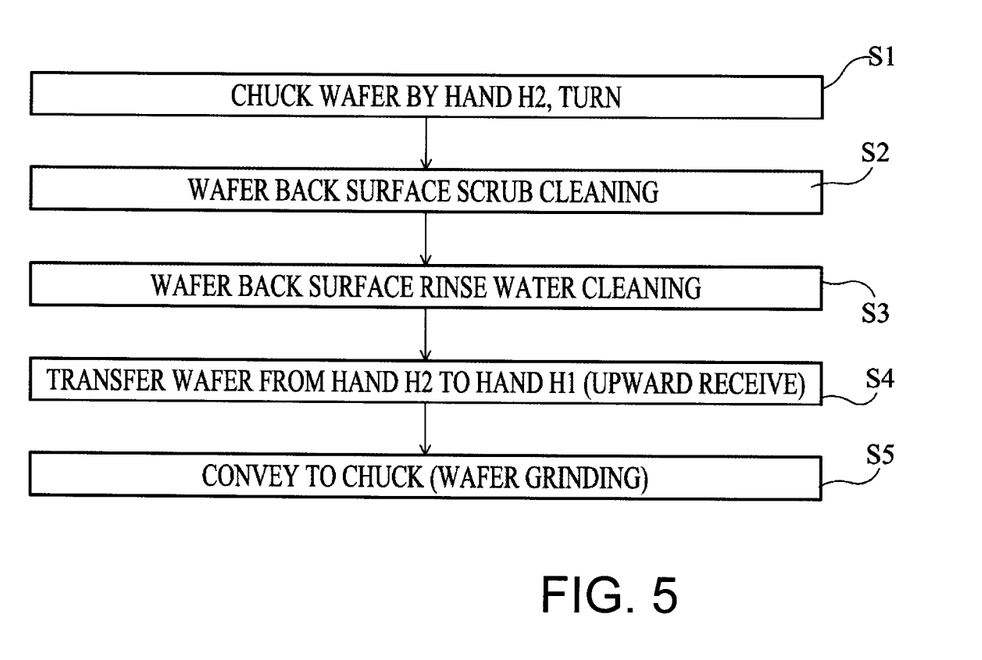
FIG. 5 is an operation flow diagram illustrating an example of operations in the wafer back surface cleaning device.

Then, an example of the operations of the wafer back surface cleaning device 10 will be described. FIG. 5 is a flowchart illustrating an example of the operations of the wafer back surface cleaning device 10, and FIG. 6 is an operation diagram of the wafer back surface cleaning device 10 corresponding to the flowchart illustrated in FIG. 5. Steps S1 to S5 illustrated in FIG. 5 will be described in this order with reference to the operation diagram illustrated in FIG. 6 in addition to the operation flow illustrated in FIG. 5.

First, as illustrated in FIG. 6(*a*), the wafer W before grinding is carried onto the alignment 11 by the hand H1, and is arranged with the front surface of the wafer W directed upward. The wafer W before grinding that has been conveyed onto the alignment 11 is chucked (gripped) by the hand H2, and the hand H2 carries the wafer W to a cleaning position while turning as it is (steps S1 and FIGS. 6(*b*) and 6(*c*)).

At the cleaning position, the cleaning pad 13 is arranged at an upper position where scrub cleaning treatment is performed. The hand H2 presses the back surface side of the wafer W against the cleaning pad 13 that is rotating integrally with the rotation plate 12, to perform scrub cleaning (step S2). In the scrub cleaning treatment, the cleaning pad 13 moves to a position protruding more upward than the cleaning water discharge port of the cleaning water supply nozzle 14, to perform scrub cleaning using cleaning water discharged from the discharge port of the cleaning water supply nozzle 14 and discharged toward the back surface of the wafer W. As a result, dirt on the back surface of the wafer can be removed using the cleaning pad 13 such as a sponge.

Figure 6A:
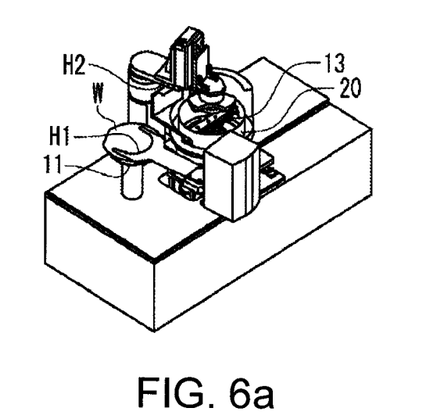
FIGS. 6a-e are an explanatory view of the operations in the wafer back surface cleaning device.
Figure 6B:
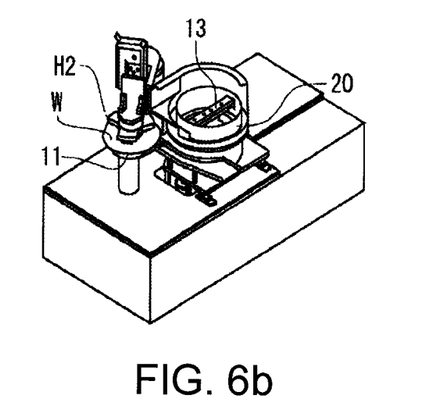
Figure 6C:
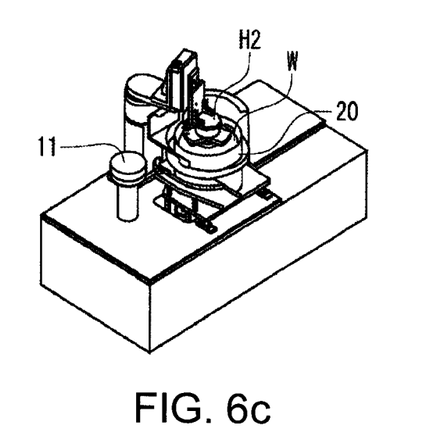
Figure 6D:
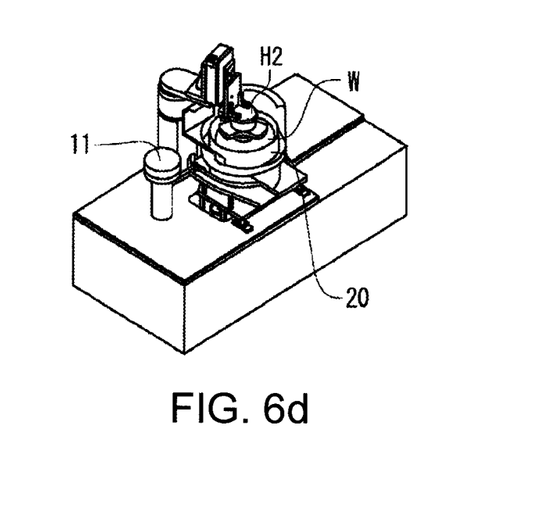

When the scrub cleaning treatment is finished, the cleaning pad 13 falls, to enter a state where the cleaning water supply nozzle 14 protrudes more upward than the cleaning pad 13. Then, rinse cleaning treatment is performed with the cleaning water discharged from the cleaning water supply nozzle 14 (step S3 and FIG. 6(*d*)). That is, cleaning water for finish is poured over the entire back surface of the wafer to perform the rinse cleaning treatment, whereby dirt that has floated by the scrub cleaning treatment can be further removed.

Figure 6E:
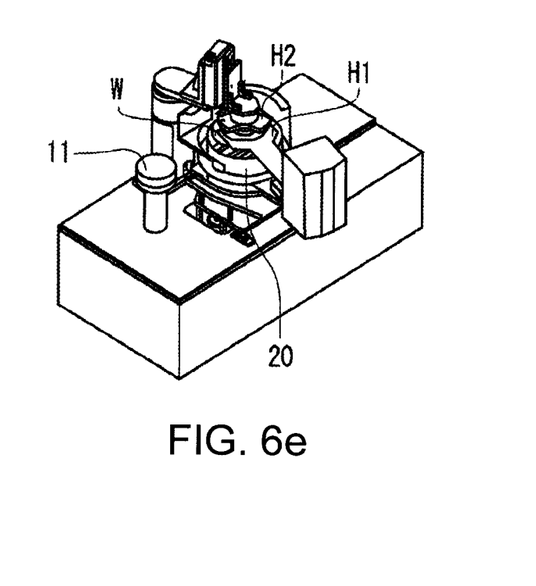

When the rinse cleaning treatment is finished, the rotation of the rotation plate 12 is stopped, and the discharge of the cleaning water from the cleaning water supply nozzle 14 is stopped. The hand H2, together with the wafer W that has been subjected to the cleaning treatment, rises to a predetermined position, and the wafer W is transferred to the hand H1 with the front surface of the wafer directed upward (step S4 and FIG. 6(*e*)). The wafer W received by the hand H1 is received from the hand H2 with an outer peripheral portion of the wafer W gripped such that the front and back surfaces of the wafer W are not contaminated.

The hand H1 that has received the wafer W after the cleaning treatment conveys the received wafer W to a wafer grinding process as a subsequent process (step S5). As a result, one cycle of operations is finished.

Therefore, with the wafer back surface cleaning device 10 according to the present embodiment, the wafer W before wafer grinding placed at a predetermined position of the alignment 11 or the like is gripped by the hand H2 with the back surface of the wafer W directed downward, and is conveyed to a cleaning position, and the back surface of the wafer W is pressed against the cleaning pad 13 at the cleaning position, to perform scrub cleaning treatment on the back surface of the wafer. After scrub cleaning, the back surface of the wafer is subjected to rinse cleaning treatment upon being supplied with cleaning water from the cleaning water supply nozzle 14, and the wafer W can be then transferred to the hand H1 with the front surface thereof directed upward. That is, the back surface of the wafer W is subjected to scrub cleaning by the cleaning pad 13 such as a sponge, and the cleaning water is further poured over the entire back surface of the wafer W from the cleaning water supply nozzle 14 as finish to perform the rinse cleaning treatment, whereby dirt, which has floated by the scrub cleaning treatment, can be removed by the rise cleaning treatment.

A series of operations performed until the wafer W is received from a predetermined position of the alignment 11 or the like by the hand H2 and transferred to the hand H1 after cleaning can be continuously performed upon being gripped by the hand H2. Accordingly, foreign matter or the like can be prevented from re-adhering to the front and back surfaces of the wafer W during and after the cleaning.

The cleaning water supply nozzle 14 discharges the cleaning water from the cleaning water supply nozzle 14 that rotates integrally with the rotation plate 12 obliquely toward the back surface of the wafer so that the cleaning water is spread over the entire back surface of the wafer W. Accordingly, foreign matter or the like that cannot be completely removed by the scrub cleaning treatment can be further removed and eliminated by the rinse cleaning treatment.

The cylindrical cover 20 arranged to surround the outer periphery of the wafer W is provided at the cleaning position. Accordingly, during each of the scrub cleaning treatment and during the rinse cleaning treatment, the cleaning liquid can be prevented from contaminating the wafer W by being splashed toward the front surface side of the wafer W to wrap around the front surface side of the wafer W and the hand H2 side.

It should be understood that various modifications can be made without departing from the spirit of the prevent invention and the present invention covers the modifications.

REFERENCE SIGNS LIST

10: back surface cleaning device
11: alignment
12: rotation plate
13: cleaning pad
14: cleaning water supply nozzle
15: wafer suction pad
20: cover
H1: hand (first hand)
H2: hand (second hand)
W: wafer

What is claimed is:

1. A wafer back surface cleaning device that cleans a back surface of a wafer, the wafer back surface cleaning device comprising:
 a first hand that receives the wafer that has been cleaned;
 a second hand that holds the wafer with its front surface directed upward, conveys the wafer before cleaning to a cleaning position, and transfers the wafer after cleaning to the first hand;
 a rotatable rotation plate provided at the cleaning position;
 a cleaning pad capable of rotating integrally with the rotation plate, and capable of contacting the back surface of the wafer by sliding arrangement to the cleaning position; and
 a cleaning water supply nozzle capable of rotating integrally with the rotation plate, and the cleaning water supply nozzle discharges cleaning water to the back surface of the wafer at the cleaning position,
 wherein the second hand brings the back surface of the wafer into contact with the cleaning pad with the cleaning water supply nozzle supplying the cleaning water to the back surface of the wafer in scrub cleaning, separates the wafer after the scrub cleaning from the cleaning pad with the cleaning water supply nozzle supplying the cleaning water to the back surface of the wafer in rinse cleaning, and transfers the wafer to the first hand after the rinse cleaning,
 whereby in scrub cleaning, the cleaning pad and the cleaning water supply nozzle rotate with the rotation plate, the cleaning pad is pressed against the back surface of the wafer, and the cleaning water supply nozzle discharges the cleaning water toward the back surface of the wafer.

2. The wafer back surface cleaning device according to claim 1, wherein the cleaning water supply nozzle discharges the cleaning water obliquely with respect to the back surface of the wafer.

3. The wafer back surface cleaning device according to claim 1, wherein a cylindrical cover arranged to surround an outer periphery of the wafer is provided at the cleaning position.

4. The wafer back surface cleaning device according to claim 1, wherein the first hand grips an outer peripheral portion of the wafer when receiving the wafer from the second hand.

* * * * *